United States Patent
Mundt et al.

(10) Patent No.: US 10,050,363 B2
(45) Date of Patent: Aug. 14, 2018

(54) VERTICAL BACKPLANE CONNECTOR

(71) Applicant: Dell Products L.P., Round Rock, TX (US)

(72) Inventors: Kevin W. Mundt, Austin, TX (US); Haesung Kwon, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/337,360

(22) Filed: Oct. 28, 2016

(65) Prior Publication Data

US 2018/0123272 A1 May 3, 2018

(51) Int. Cl.
*H01R 12/72* (2011.01)
*H01R 12/73* (2011.01)
*H01R 13/6471* (2011.01)
*H01R 13/6581* (2011.01)

(52) U.S. Cl.
CPC ......... *H01R 12/737* (2013.01); *H01R 12/724* (2013.01); *H01R 13/6471* (2013.01); *H01R 13/6581* (2013.01)

(58) Field of Classification Search
CPC ................ H01R 12/737; H01R 12/724; H01R 13/6471; H01R 13/6581
See application file for complete search history.

(56) References Cited

U.S. PATENT DOCUMENTS

| | | | | |
|---|---|---|---|---|
| 5,496,183 A * | 3/1996 | Soes | ................. | H01R 13/6471 439/607.23 |
| 7,585,186 B2 * | 9/2009 | McAlonis | ............ | H01R 13/514 439/607.05 |
| 7,993,147 B2 * | 8/2011 | Cole | .................... | H01R 13/514 439/607.39 |
| 2009/0149041 A1 * | 6/2009 | Morlion | ............... | H01R 23/688 439/65 |
| 2010/0022137 A1 * | 1/2010 | McAlonis | ............ | H01R 12/585 439/638 |
| 2010/0210123 A1 * | 8/2010 | Cole | .................... | H01R 13/514 439/79 |
| 2013/0210282 A1 * | 8/2013 | Annis | .................. | H01R 12/724 439/638 |

(Continued)

*Primary Examiner* — Edwin A. Leon
*Assistant Examiner* — Oscar Jimenez
(74) *Attorney, Agent, or Firm* — Jackson Walker L.L.P.

(57) ABSTRACT

A connector for electrically coupling an information handling resource to a backplane, may include a lead frame comprising a plurality of electrically-conductive traces configured to be electrically coupled to the backplane and a receptacle having a plurality of electrically-conductive pins each electrically coupled to a corresponding one of the plurality of electrically-conductive traces of the lead frame, configured to mechanically and electrically couple the respective modular information handling resource to the receptacle, and structurally oriented relative to the electrically-conductive traces of the lead frame and the backplane such that insertion and removal of the respective modular information handling resource to or from the receptacle is caused by applying force to the respective modular information handling resource in a direction substantially parallel to a surface of the backplane having a surface area substantially larger than that of at least all but one of other surfaces of the backplane.

19 Claims, 7 Drawing Sheets

(56) References Cited

U.S. PATENT DOCUMENTS

| | | | |
|---|---|---|---|
| 2013/0273781 A1* | 10/2013 | Buck | H01R 13/516 439/626 |
| 2014/0209371 A1* | 7/2014 | Minich | H05K 1/116 174/266 |
| 2015/0024636 A1* | 1/2015 | Tsai | H01R 12/716 439/630 |
| 2015/0162680 A1* | 6/2015 | Costello | H01R 9/2408 439/64 |
| 2015/0200496 A1* | 7/2015 | Simpson | H01R 13/5841 439/607.08 |
| 2016/0013594 A1* | 1/2016 | Costello | H01R 13/6588 439/607.12 |
| 2016/0134057 A1* | 5/2016 | Buck | H01R 13/516 439/607.05 |
| 2016/0261067 A1* | 9/2016 | Soubh | H01R 12/724 |
| 2016/0322760 A1* | 11/2016 | Long | H01R 13/6587 |
| 2016/0365654 A1* | 12/2016 | Wormsbecher | H01R 12/7076 |

* cited by examiner

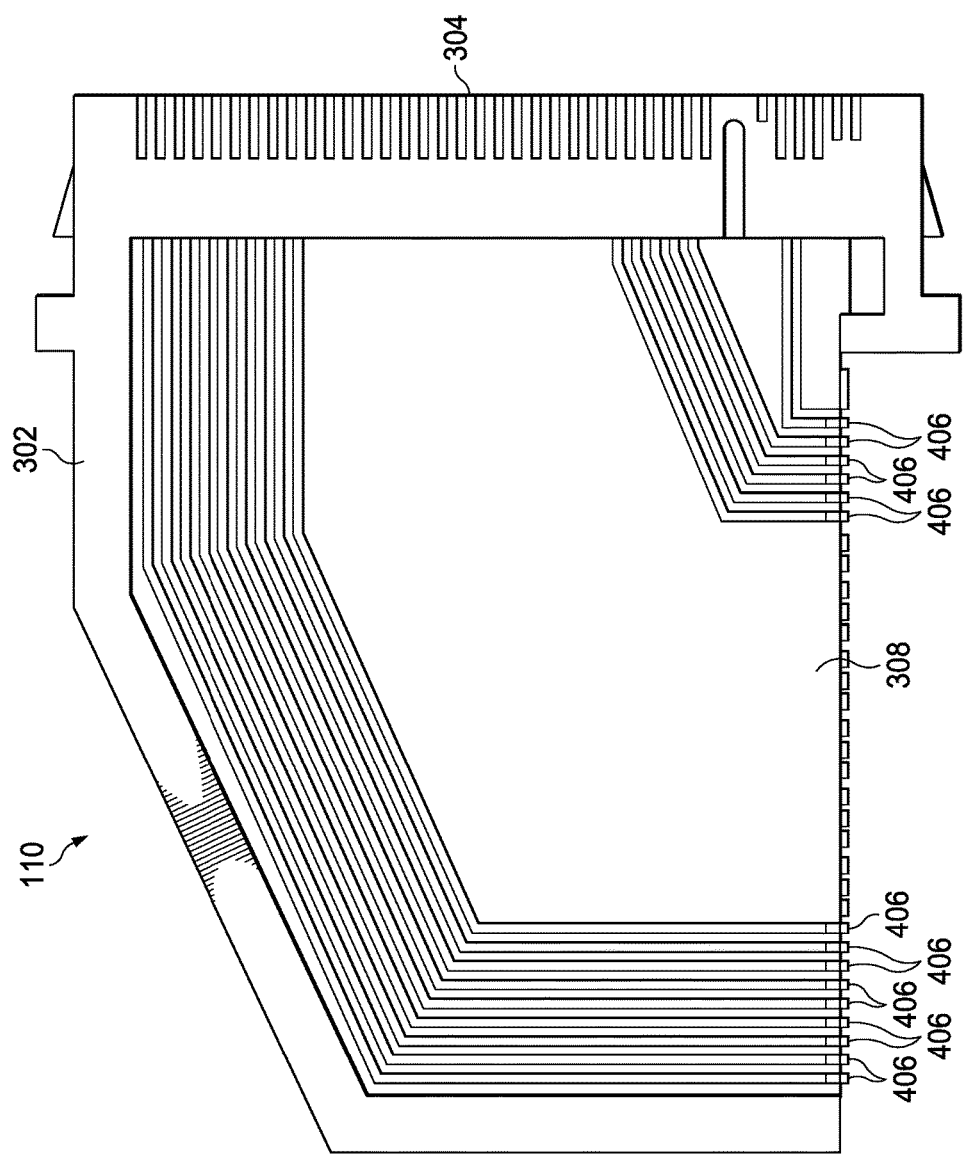

VERTICAL BACKPLANE CONNECTOR

TECHNICAL FIELD

The present disclosure relates in general to information handling systems, and more particularly to systems and methods for coupling a modular information handling resource to a backplane using a connector having a receptacle generally perpendicular to the backplane.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis.

In an information handling system, a modular information handling resource (e.g., a hard disk drive or other storage resource) may be electrically and mechanically coupled to a circuit board via a connector. In the case of storage resources coupled to a backplane, using traditional approaches, density of connector spacing and necessary routing on a backplane may prevent the use of air passages through a backplane in order to facilitate cooling of an information handling system. Accordingly, use of a traditional "vertical" backplane, oriented in a manner so as to receive modular information handling resources which are translated in a direction perpendicular to the surface of the backplane in order to insert and remove such modular information handling resources, may block such flow of air.

SUMMARY

In accordance with the teachings of the present disclosure, the disadvantages and problems associated with board-to-board coupling may be reduced or eliminated.

In accordance with embodiments of the present disclosure, an information handling system may include a backplane and a plurality of connectors each electrically and mechanically coupled to the backplane, each connector of the plurality of connectors configured to receive a respective modular information handling resource in order to electrically couple the respective modular information handling resource to the backplane. Each connector may include a lead frame comprising a plurality of electrically-conductive traces electrically coupled to the backplane and a receptacle having a plurality of electrically-conductive pins each electrically coupled to a corresponding one of the plurality of electrically-conductive traces of the lead frame, configured to mechanically and electrically couple the respective modular information handling resource to the receptacle, and structurally oriented relative to the electrically-conductive traces of the lead frame and the backplane such that insertion and removal of the respective modular information handling resource to or from the receptacle is caused by applying force to the respective modular information handling resource in a direction substantially parallel to a surface of the backplane having a surface area substantially larger than that of at least all but one of other surfaces of the backplane.

In accordance with these and other embodiments of the present disclosure, a connector for electrically coupling an information handling resource to a backplane, may include a lead frame comprising a plurality of electrically-conductive traces configured to be electrically coupled to the backplane and a receptacle having a plurality of electrically-conductive pins each electrically coupled to a corresponding one of the plurality of electrically-conductive traces of the lead frame, configured to mechanically and electrically couple the respective modular information handling resource to the receptacle, and structurally oriented relative to the electrically-conductive traces of the lead frame and the backplane such that insertion and removal of the respective modular information handling resource to or from the receptacle is caused by applying force to the respective modular information handling resource in a direction substantially parallel to a surface of the backplane having a surface area substantially larger than that of at least all but one of other surfaces of the backplane.

In accordance with these and other embodiments of the present disclosure, a method for forming a connector for electrically coupling an information handling resource to a backplane may include providing a lead frame comprising a plurality of electrically-conductive traces configured to be electrically coupled to the backplane and mechanically and electrically coupling the lead frame to a receptacle having a plurality of electrically-conductive pins such that each of the plurality of electrically-conductive pins are electrically coupled to a corresponding one of the plurality of electrically-conductive traces of the lead frame, is configured to mechanically and electrically couple the respective modular information handling resource to the receptacle, and is structurally oriented relative to the electrically-conductive traces of the lead frame and the backplane such that insertion and removal of the respective modular information handling resource to or from the receptacle is caused by applying force to the respective modular information handling resource in a direction substantially parallel to a surface of the backplane having a surface area substantially larger than that of at least all but one of other surfaces of the backplane.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4A illustrates a side view of selected components of the example connector of FIG. 3A with a shield removed, in accordance with embodiments of the present disclosure.

DETAILED DESCRIPTION

Figure 1:
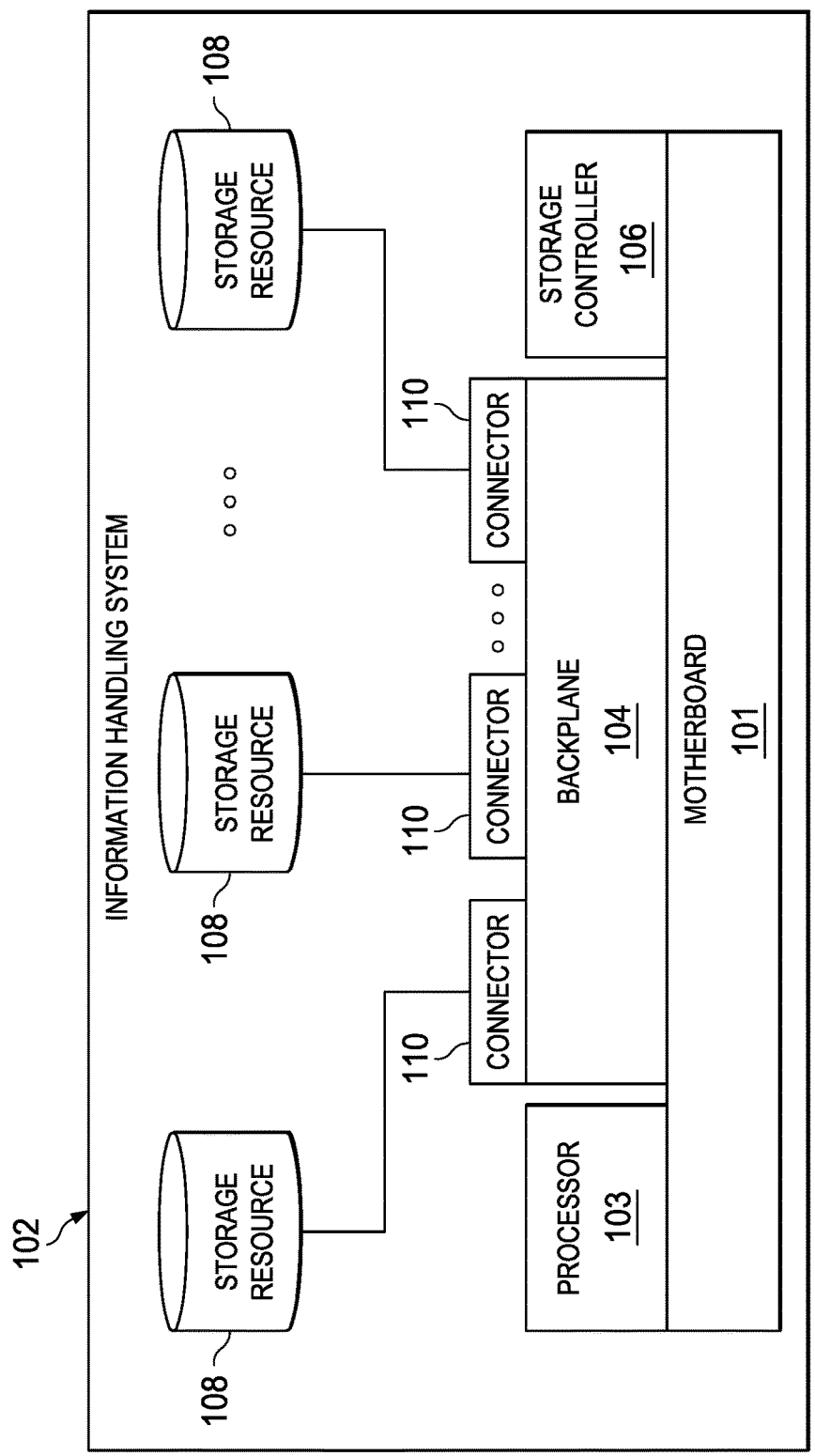
FIG. 1 illustrates a block diagram of selected components of an example information handling system, in accordance with embodiments of the present disclosure.

Preferred embodiments and their advantages are best understood by reference to FIGS. 1-4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a backplane 104 coupled to motherboard 101, a storage controller 106 coupled to motherboard 101, a plurality of connectors 110 mechanically and electrically coupled to backplane 104, and a plurality of storage resources 108 each electrically coupled to backplane 104 via a respective connector 110. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource 108, memory and/or another component of information handling system 102.

Backplane 104 may comprise any system, device, or apparatus configured to interconnect information handling system 102 with information handling resources of information handling system 102. As shown, backplane 104 may have a plurality of connectors 110 mechanically and electrically coupled thereto.

A connector 110 may comprise any system, device, or apparatus fixedly mounted on backplane 104 and may be constructed to mechanically couple a corresponding storage resource 108 to backplane 104 and to electrically couple such storage resource 108 to backplane 104, processor 103, and/or other components of information handling system 102. Connector 110 may include a receptacle slot or other opening configured to removably receive a corresponding mating edge connector of a storage resource 108. Example embodiments of connector 110 are set forth in greater detail with respect to FIGS. 2A through 4B below.

Storage controller 106 may include any system, apparatus, or device operable to manage the communication of data between processor 103 and one or more of storage resources 108. In certain embodiments, a storage controller 106 may provide functionality including, without limitation, disk aggregation and redundancy (e.g., RAID), I/O routing, and error detection and recovery. As shown in FIG. 1, a storage controller 106 may be coupled to backplane 104 (e.g., via a connector, as described in greater detail below) and motherboard 101 (e.g., via another connector, as described in greater detail below). Storage controller 106 may also have features supporting shared storage and high availability. In some embodiments, storage controller 106 may comprise a PowerEdge RAID Controller (PERC) manufactured by Dell Inc.

Storage resources 108 may be mechanically and electrically coupled to backplane 104 via respective connectors 110, and thus also electrically coupled to storage controller 106 and/or processor 103. A storage resource 108 may comprise any system, device, or apparatus configured to retain program instructions and/or data for a period of time (e.g., computer-readable media). Storage resources 108 may include hard disk drives, magnetic tape libraries, optical disk drives, magneto-optical disk drives, compact disk drives, compact disk arrays, disk array controllers, and/or any other system, apparatus or device operable to store media.

In particular embodiments, storage resources 108 may comprise M.2 storage devices, in which case connectors 110 may comprise M.2 connectors (e.g., connectors 110 having gold-plated pads along the edge of a circuit board that mate with pins of a receptacle of connectors 110). In some of such particular embodiments, storage resources 108 and connectors 110 may mate with each other in a card-edge style interface.

In addition to motherboard 101, processor 103, backplane 104, connectors 110, storage controller 106, and storage resources 108, information handling system 102 may include one or more other information handling resources.

Figure 2A:
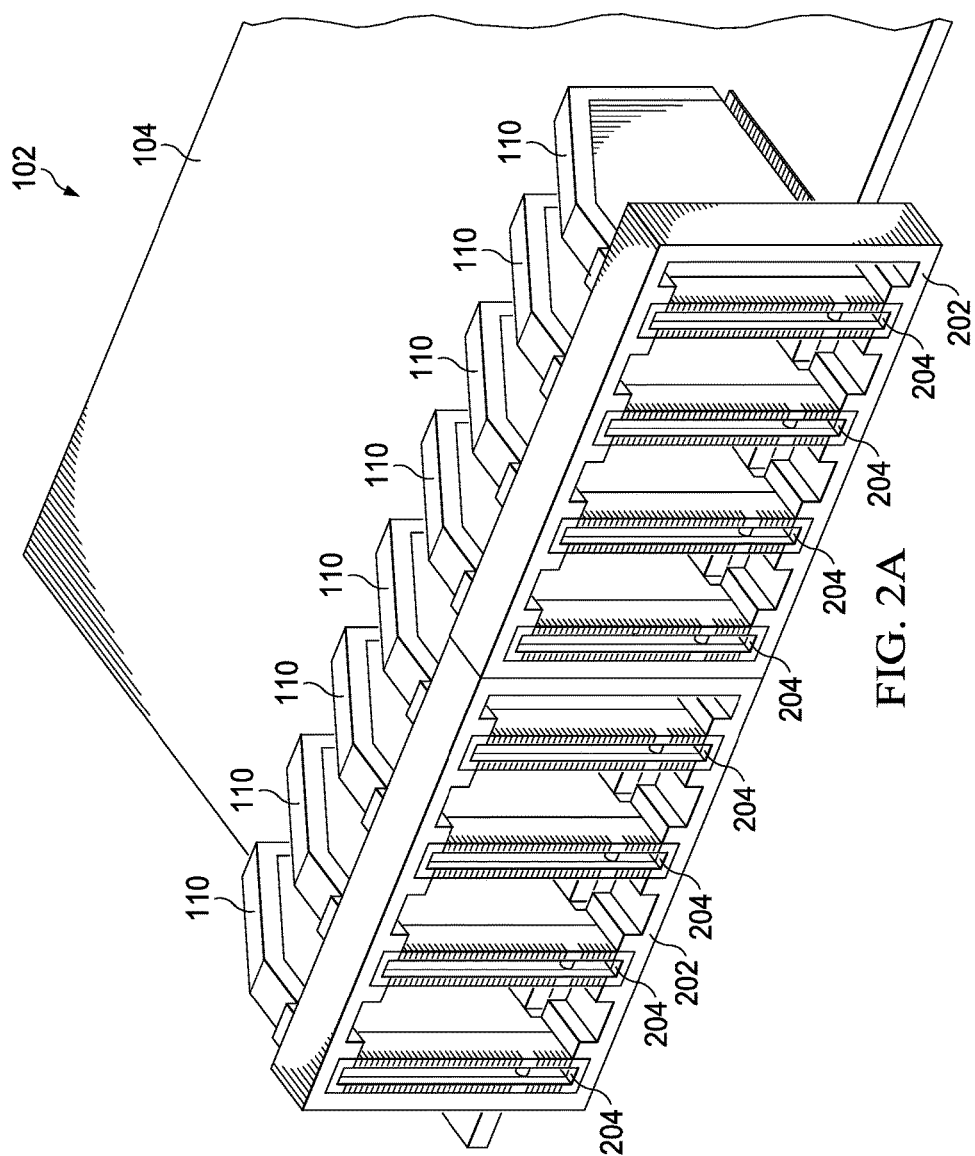
FIG. 2A illustrates a perspective view of selected components of the example information handling system of FIG. 1, in accordance with embodiments of the present disclosure.
Figure 2B:
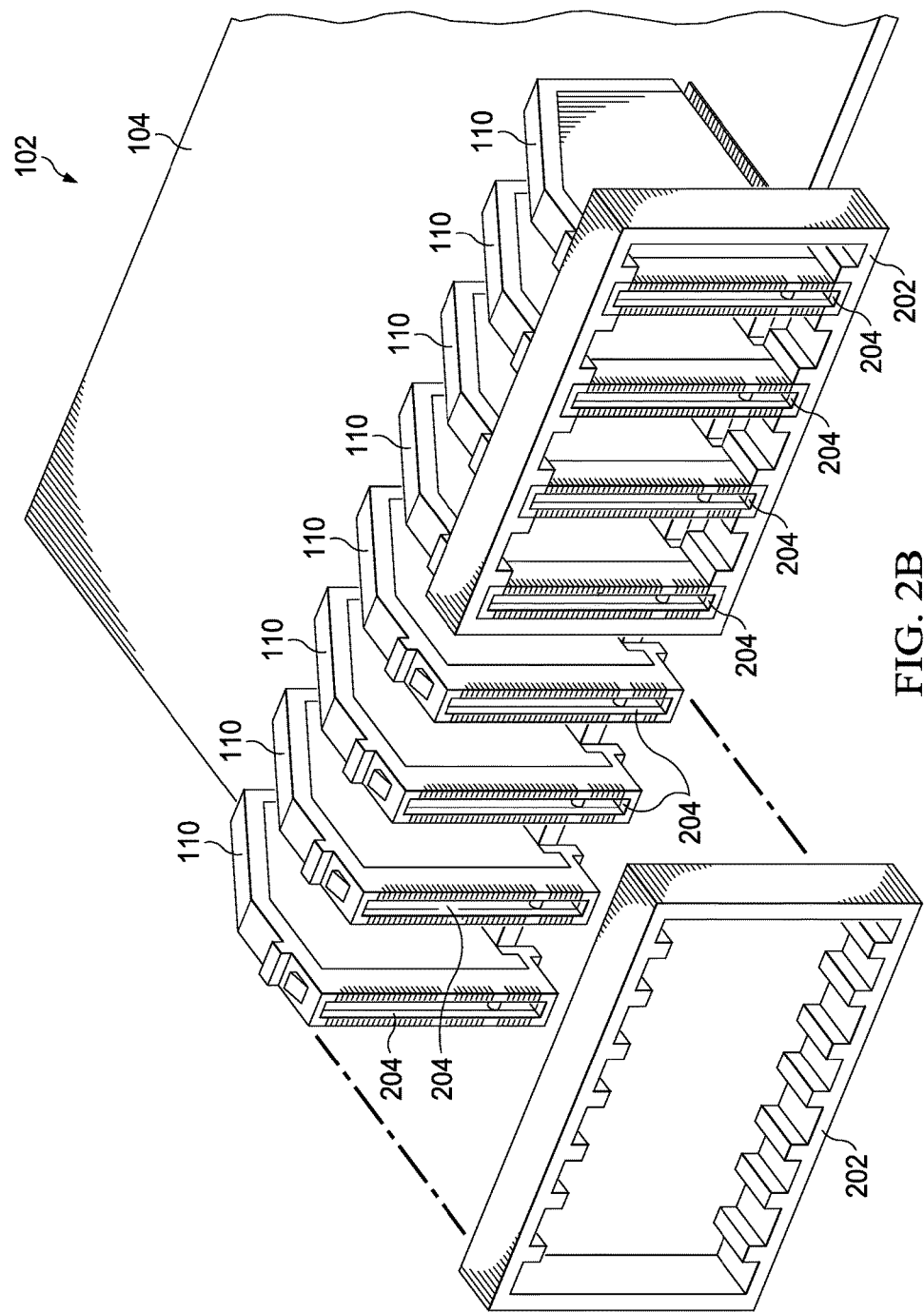
FIG. 2B illustrates a partially-exploded perspective view of selected components of the example information handling system of FIG. 1 with a frame removed, in accordance with embodiments of the present disclosure.

FIG. 2A illustrates a perspective view of selected components of example information handling system 102, in accordance with embodiments of the present disclosure. FIG. 2B illustrates a partially-exploded perspective view of selected components of example information handling system 102 showing a frame 202 removed, in accordance with embodiments of the present disclosure. As shown in FIGS. 2A and 2B, backplane 104 may be oriented in a "horizontal" position in that it is generally perpendicular to a face of a chassis comprising information handling system 102 via which a user may insert or remove modular storage resources 108 from receptacles 204 of connectors 110 which may be mechanically coupled to backplane 104. Accordingly, receptacles 204 may be oriented with respect to backplane 104 such that storage resources 108 are inserted into or removed from receptacles 204 by translating storage resources in a direction substantially parallel to a plane defined by a surface of backplane 104 (e.g., the planar surface of backplane 104 having a surface area greater than at least all other sides of backplane 104 except for one side that may be opposite of the surface in question) in order to couple or decouple a connector of a storage resource 108 to corresponding conductive pins of a respective receptacle 204.

As also shown in FIGS. 2A and 2B, information handling system 102 may include one or more mechanical frames 202. A frame 202 may be configured that structurally aggregates a plurality of connectors 110, thus aligning such plurality of connectors 110 as a single structural entity. Thus, frames 202 may allow for placement and solder assembly of single connectors 110 to backplane 104 and constraint of a larger footprint while having minimal impact to air passages between connectors. Frames 202 may also provide more structural integrity to information handling system 102 so as to prevent damage to connectors 110 and/or the electrical coupling between connectors 110 and backplane 104 during insertion and removal of storage resources 108.

Figure 3A:
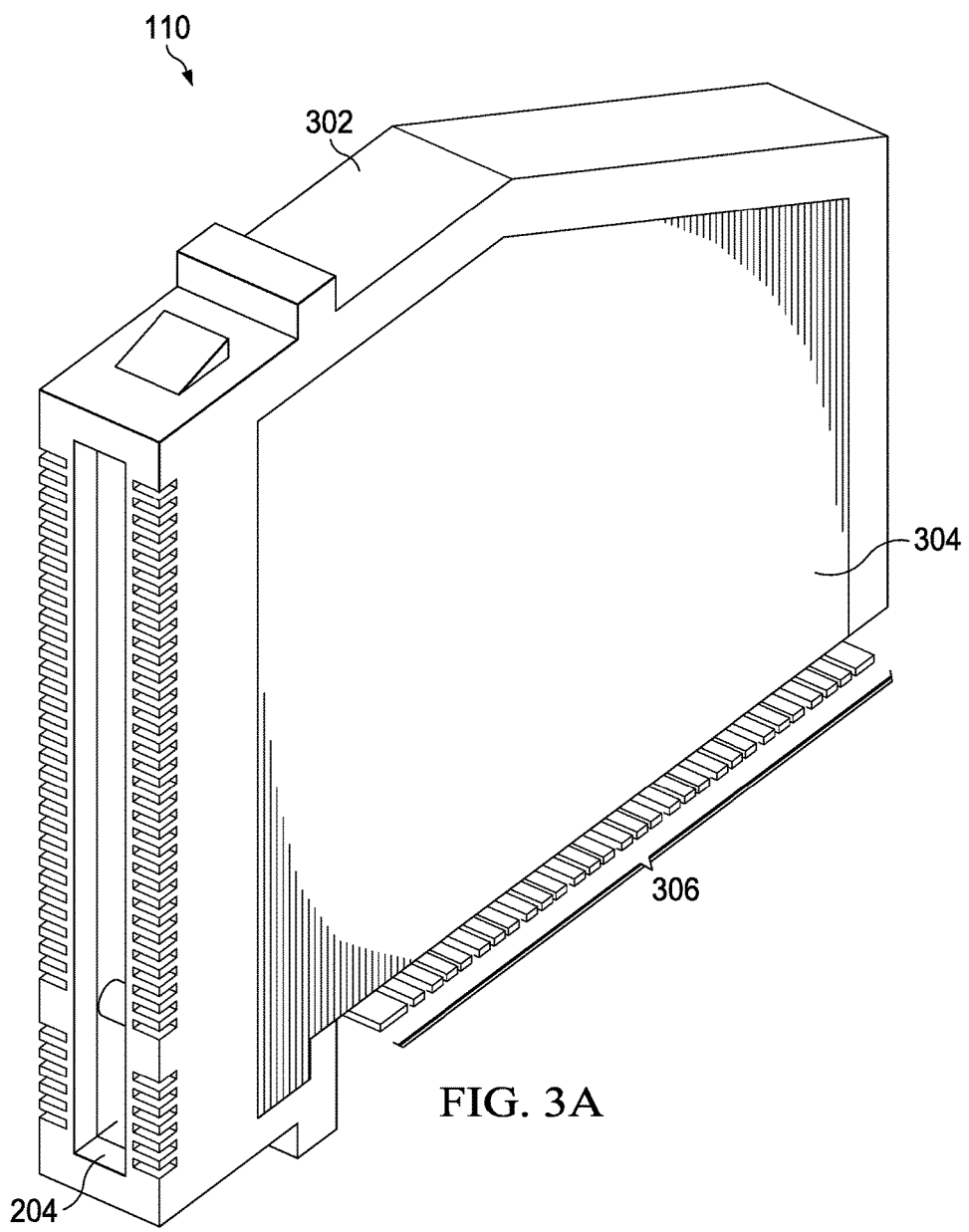
FIG. 3A illustrates a perspective view of selected components of an example connector for use in the example information handling system of FIG. 1, in accordance with embodiments of the present disclosure.
Figure 3B:
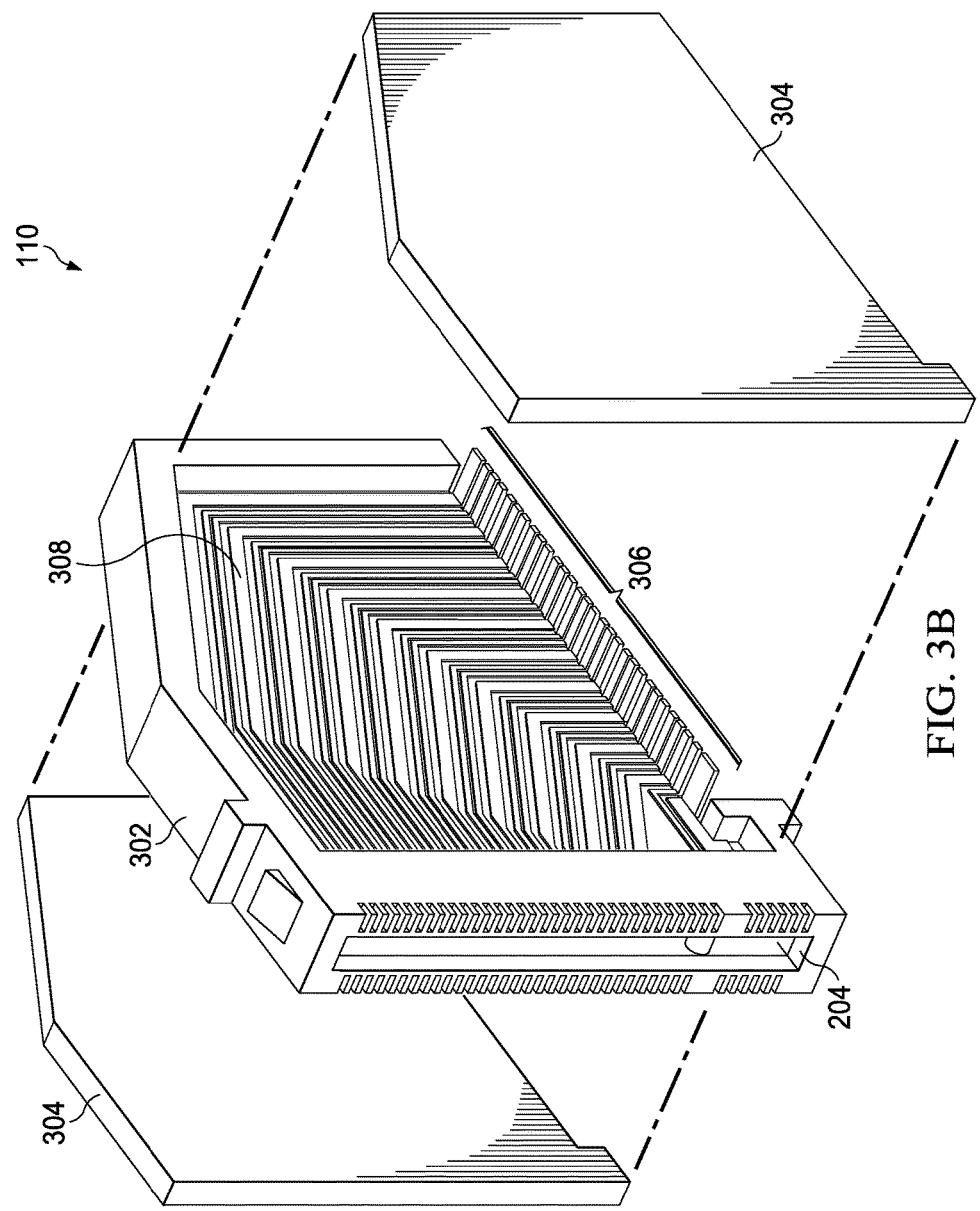
FIG. 3B illustrates an exploded perspective view of selected components of the example connector of FIG. 3B, in accordance with embodiments of the present disclosure.

FIG. 3A illustrates a perspective view of selected components of an example connector 110, in accordance with embodiments of the present disclosure. FIG. 3B illustrates an exploded perspective view of selected components of example connector 110, in accordance with embodiments of the present disclosure. As shown in FIGS. 3A and 3B, a connector 110 may comprise a housing 302, a receptacle 204, at least two shields 304, a plurality of pads 306, and a lead frame 308. Housing 302 may comprise any suitable structural member configured to structurally support receptacle 204, lead frame 308 and shields 304. Accordingly, housing 302 may be constructed from any suitable material (e.g., plastic).

Shields 304 may comprise any material (e.g., conductive engineered plastic) that may be inserted on a side of connector 110 in order to, along with housing 302, enclose a side of lead frame 308, and which may serve to dampen electrical crosstalk between conductive traces formed in lead frame 308 (such conductive traces are described in greater detail below). Accordingly, presence of shields 304 may enhance signal integrity of signals communicated through traces of lead frame 308.

Each of pads 306 may comprise any suitable conductor for electrically coupling traces of lead frame 308 to corresponding conductive traces of backplane 104. FIGS. 3A and 3B depict pads 306 as surface-mount technology pads. However, any suitable pads may be used to implement pads 306 (e.g., surface-mount technology, through-holes, press-fit, etc.).

Lead frame 308 may be generally planar in shape and may be mechanically coupled to housing 302 and receptacle 204. As shown in greater detail below, lead frame 308 may comprise a plurality of conductive traces for conveying electrical signals between respective pins of receptacle 204 and pads 306, as well as one or more ground traces. As evident from FIGS. 2A-3B, each surface of lead frame 308 (e.g., the planar surfaces of lead frame 308 having the greatest amount of area) extends perpendicularly from backplane 104 and is mechanically and electrically coupled to receptacle 204 such that storage resources 108 are inserted into or removed from receptacles 204 by translating storage resources in a direction substantially parallel to a plane defined by a surface of backplane 104 (e.g., the planar surface of backplane 104 having the greatest amount of area) in order to couple or decouple a connector of a storage resource 108 to corresponding conductive pins of a respective receptacle 204.

Figure 4B:
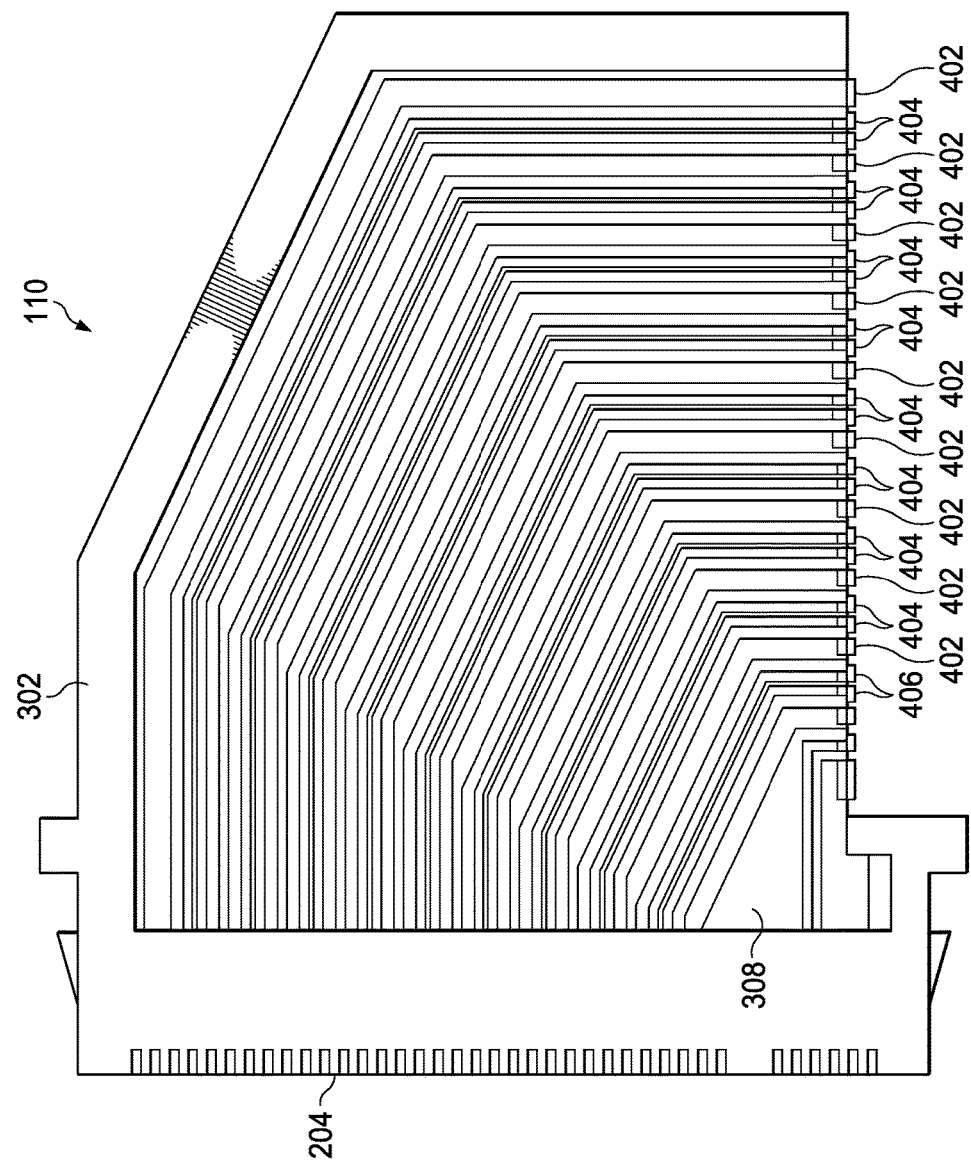
FIG. 4B illustrates a side view of a side opposite of that shown in FIG. 4A of selected components of the example connector of FIG. 3A with a shield removed, in accordance with embodiments of the present disclosure.

FIG. 4A illustrates a side view of selected components of a connector 110 with a shield 304 covering such side removed, in accordance with embodiments of the present disclosure. FIG. 4B illustrates a side view of a side opposite of that shown in FIG. 4A of selected components of a connector 110 with a shield 304 covering such side removed, in accordance with embodiments of the present disclosure. In the embodiments represented by FIGS. 4A and 4B, one side (e.g., surface) of lead frame 308 may comprise electrically-conductive traces 406 insulated from each other by electrical-insulating material, while the other side (e.g. surface) of lead frame 308 may comprise electrically-conductive traces 402 and 404 insulated from each other by electrical-insulating material. For example, in the embodiments represented by FIGS. 4A and 4B, conductive traces 406 may comprise traces for providing supply rail voltages (e.g., power and ground voltages) and/or signal traces for carrying single-ended signals, while traces 404 comprise differential-pair signal traces for carrying differential signals and traces 402 comprise shield or shepherding traces which may be tied to a rail voltage (e.g., ground) for reducing electrical coupling between adjacent differential pairs of traces 404. In some embodiments, each trace in a pair of differential-pair signal traces 404 may be formed such that they are impedance matched to one another. For example, to compensate for a length of one trace 404 of the differential pair being longer than the other, the corresponding traces of backplane 104 to which such traces 404 are coupled may be sized or otherwise designed in order to equalize overall impedances and lengths of the overall conductive paths including the two traces 404 of a differential pair.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
    a backplane having a planar surface, a first edge, and a second edge opposite the first edge; and
    a plurality of connectors each electrically and mechanically coupled to the backplane, each connector of the plurality of connectors oriented perpendicular to the planar surface and configured to receive a respective modular information handling resource in order to electrically couple the respective modular information handling resource to the backplane, wherein the plurality of connectors is disposed within a mechanical frame coupled to the backplane, and wherein the received modular information handling resources are disposed substantially perpendicularly to the planar surface and lie along a direction from the first edge toward the second edge, the plurality of connectors and respective received modular information handling resources defining airflow passages disposed between adjacent modular information handling resources and directed through the mechanical frame along the direction, each connector comprising:
        a lead frame comprising a plurality of electrically-conductive traces electrically coupled to the backplane; and
        a receptacle having a plurality of electrically-conductive pins each electrically coupled to a corresponding one of the plurality of electrically-conductive traces of the lead frame, configured to mechanically and electrically couple the respective modular information handling resource to the receptacle, and structurally oriented relative to the electrically-conductive traces of the lead frame and the backplane such that insertion and removal of the respective modular information handling resource to or from the receptacle is caused by applying force to the respective modular information handling resource along the direction.

2. The information handling system of claim 1, wherein each connector of the plurality of connectors comprises at least one shield mechanically covering a respective side of the lead frame of the connector in order to dampen electrical cross talk between electrically-conductive traces of the lead frame.

3. The information handling system of claim 1, wherein for each lead frame, the electrically-conductive traces of the lead frame comprise at least:
    a first differential pair of adjacent traces on a side of the lead frame for conducting a first differential electrical signal;
    a second differential pair of adjacent traces on the side for conducting a second differential electrical signal; and
    a shield trace on the side and formed between the first differential pair and the second differential pair and electrically coupled to a rail voltage of a power supply.

4. The information handling system of claim 3, wherein traces of the first differential pair are impedance matched to one another.

5. The information handling system of claim 1, wherein the respective information handling resource comprises a storage resource.

6. The information handling system of claim 1, further comprising an enclosing frame disposed around the respective receptacles, wherein the enclosing frame includes apertures therein corresponding to the airflow passages.

7. The information handling system of claim 1, wherein the receptacles are M.2 receptacles.

8. A connector for electrically coupling an information handling resource to a backplane that has a planar surface, a first edge, and a second edge opposite the first edge, the connector comprising:
a lead frame oriented perpendicular to the planar surface and comprising a plurality of electrically-conductive traces configured to be electrically coupled to the backplane; and
a receptacle oriented perpendicular to the planar surface and having a plurality of electrically-conductive pins each electrically coupled to a corresponding one of the plurality of electrically-conductive traces of the lead frame, configured to mechanically and electrically couple the respective modular information handling resource to the receptacle such that the modular information handling resource is disposed substantially perpendicularly to the planar surface and lies along a direction from the first edge toward the second edge, wherein the connector is disposed within a mechanical frame coupled to the backplane, and such that the connector and the modular information handling resource define airflow passages on either side thereof within the mechanical frame directed through the mechanical frame and along the direction, the receptacle being structurally oriented relative to the electrically-conductive traces of the lead frame and the backplane such that insertion and removal of the respective modular information handling resource to or from the receptacle is caused by applying force to the respective modular information handling resource along the direction.

9. The connector of claim 8, further comprising at least one shield mechanically covering a respective side of the lead frame of the connector in order to dampen electrical cross talk between electrically-conductive traces of the lead frame.

10. The connector of claim 8, wherein the electrically-conductive traces of the lead frame comprise at least:
a first differential pair of adjacent traces on a side of the lead frame for conducting a first differential electrical signal;
a second differential pair of adjacent traces on the side for conducting a second differential electrical signal; and
a shield trace on the side and formed between the first differential pair and the second differential pair and configured to be electrically coupled to a rail voltage of a power supply.

11. The connector of claim 10, wherein traces of the first differential pair are impedance matched to one another.

12. The connector of claim 8, wherein the respective information handling resource comprises a storage resource.

13. The connector of claim 8, wherein the receptacle is an M.2 receptacle.

14. A method for forming a connector for electrically coupling a modular information handling resource to a backplane that has a planar surface, a first edge, and a second edge opposite the first edge, the method comprising:
providing a lead frame oriented perpendicular to the planar surface and comprising a plurality of electrically-conductive traces configured to be electrically coupled to the backplane; and
mechanically and electrically coupling the lead frame to a receptacle oriented perpendicular to the planar surface and having a plurality of electrically-conductive pins such that each of the plurality of electrically-conductive pins is electrically coupled to a corresponding one of the plurality of electrically-conductive traces of the lead frame, is configured to mechanically and electrically couple the modular information handling resource to the receptacle such that the modular information handling resource is disposed substantially perpendicularly to the planar surface and lies along a direction from the first edge toward the second edge, wherein the connector is disposed within a mechanical frame coupled to the backplane, and such that the connector and the modular information handling resource define airflow passages on either side thereof within the mechanical frame directed through the mechanical frame and along the direction, and is structurally oriented relative to the electrically-conductive traces of the lead frame and the backplane such that insertion and removal of the respective modular information handling resource to or from the receptacle is caused by applying force to the respective modular information handling resource along the direction.

15. The method of claim 14, further comprising mechanically coupling at least one shield to the lead frame to cover a respective side of the lead frame of the connector in order to dampen electrical cross talk between electrically-conductive traces of the lead frame.

16. The method of claim 14, wherein the electrically-conductive traces of the lead frame comprise at least:
a first differential pair of adjacent traces on a side of the lead frame for conducting a first differential electrical signal;
a second differential pair of adjacent traces on the side for conducting a second differential electrical signal; and
a shield trace on the side and formed between the first differential pair and the second differential pair and configured to be electrically coupled to a rail voltage of a power supply.

17. The method of claim 16, wherein traces of the first differential pair are impedance matched to one another.

18. The method of claim 14, wherein the respective information handling resource comprises a storage resource.

19. The method of claim 14, wherein the receptacle is an M.2 receptacle.

* * * * *